United States Patent
Wang et al.

(10) Patent No.: US 7,452,805 B2
(45) Date of Patent: Nov. 18, 2008

(54) ALUMINUM BASED CONDUCTOR FOR VIA FILL AND INTERCONNECT

(75) Inventors: Chao-Hsiung Wang, Hsin-Chu (TW); Chien-Chao Huang, Hsin-Chu (TW); Chenming Hu, Oakland, CA (US); Horng-Huei Tseng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 199 days.

(21) Appl. No.: 11/385,923

(22) Filed: Mar. 20, 2006

(65) Prior Publication Data

US 2007/0218686 A1    Sep. 20, 2007

(51) Int. Cl.
*H01L 21/4763* (2006.01)

(52) U.S. Cl. ............... 438/629; 438/688; 257/E21.585
(58) Field of Classification Search ......... 438/618–630, 438/652, 672, 688; 257/758–765, E21.579, 257/E21.584, E21.585, E21.586
See application file for complete search history.

(56) References Cited

U.S. PATENT DOCUMENTS 5,956,609 A * 9/1999 Lee et al. .................... 438/627
6,329,282 B1 * 12/2001 Hsu et al. .................... 438/625

\* cited by examiner

*Primary Examiner*—Brook Kebede
(74) *Attorney, Agent, or Firm*—Tung & Associates

(57) ABSTRACT

A semiconductor device including a dielectric layer having a opening form therein having a cross-sectional area of less than 1 $\mu m^2$ and a PVD aluminum base conductor filled in the opening.

23 Claims, 5 Drawing Sheets

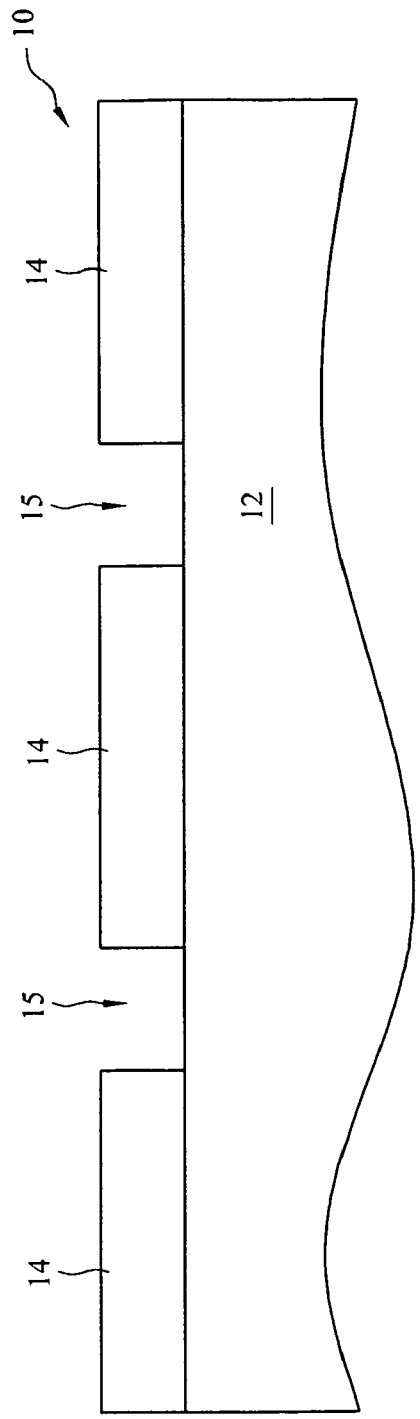
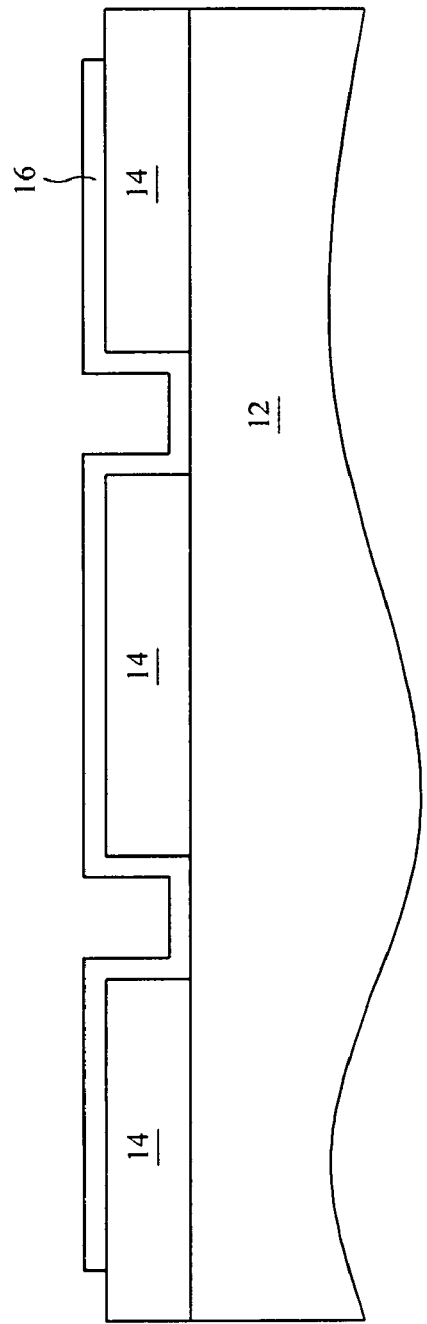
Fig. 1A
Fig. 1B

ALUMINUM BASED CONDUCTOR FOR VIA FILL AND INTERCONNECT

FIELD OF THE INVENTION

The present invention relates to semiconductor devices and methods of making the same, and more particularly to semiconductor devices and methods using aluminum for via fill in interconnects.

BACKGROUND OF THE INVENTION

Clevenger et al., U.S. Pat. No. 6,448,173, issued Sep. 10, 2002, discloses a dual damascene process capable of reliably producing aluminum interconnects that exhibit improved electromigration characteristics over aluminum interconnects produced by conventional RIE techniques. The dual damascene process relies on a PVD-Ti/CVD-TiN barrier layer that produces aluminum lines that exhibit significantly reduced saturation resistance levels and/or suppressed electromigration, particularly in lines longer than 100 micrometers.

Bothra, U.S. Pat. No. 6,297,557, issued Oct. 2, 2001, discloses an aluminum filled via hole for use in a semiconductor interconnect structure. The aluminum filled via hole in a semiconductor interconnect structure includes a first patterned metallization layer lying over a first dielectric layer. A second dielectric layer overlying the first patterned metallization layer and the first dielectric layer. An aluminum filled via hole defined through the second dielectric layer and in contact with the first patterned metallization layer. The aluminum filled via hole has an electromigration barrier cap over a top most portion of the aluminum filled via hole that is substantially level with the second dielectric layer. The electromigration barrier cap has a thickness of between about 500 angstroms and about 2500 angstroms. An electromigration barrier layer is deposited over the second dielectric layer and within the recess gap. The electromigration barrier is preferably a titanium tungsten, a tungsten, or tungsten silicide layer deposited using a sputter process or CVD process to a thickness of about 1000 angstroms to about 300 angstroms.

It is heretofore been known to combine CVD aluminum technology with an overlayer of PVD aluminum deposited to fill small geometries.

Heretofore it has also been known to use CVD aluminum plugs to deposit the plug fill and interconnect in the same deposition step. Chemical vapor deposition of aluminum plugs using MOCVD precursors such as dimethyl aluminum hydride has been known to offer a means for forming plugs and interconnects with high quality aluminum films at process temperatures below 200° C.

Heretofore it has also been known to utilize an unsequential deposition of thin CVD aluminum film and PVD Al (Cu). The chemical vapor deposition aluminum is deposited at low temperatures using dimethyl-aluminum hydride.

Chio et al., U.S. Pat. No. 5,629,238, issued May 13, 1997, discloses a method of forming a conductive line using a fluorine doped oxide layer as an insulating layer between conductive lines. The method comprises the steps of: (a) forming a fluorine doped oxide layer on a semiconductor substrate on which a lower structure is formed; (b) etching the oxide layer of the region where a conductive line is to be formed, followed by forming a trench; (c) forming an insulating layer over the overall surface of the resultant substrate; (d) depositing conductive material on the resulting substrate; and (e) etching back the conductive material so that the conductive material is left on the trench only, thereby forming a conductive line. The conductive line is formed of aluminum-containing material and the insulating layer is formed of silicon dioxide. The insulating layer is interposed between the fluorine doped oxide layer and the aluminum-containing conductive line and the conductive line is free from corrosion.

Lee et al., U.S. Pat. No. 5,843,843, issued Dec. 1, 1998, discloses metal wiring structures for integrated circuits including a seed layer formed on an integrated circuit substrate and a wetting layer formed on the seed layer opposite the integrated circuit substrate. The metal wiring layer is formed on the wetting layer opposite the seed layer. The seed layer and the metal wiring layer have the same crystal orientation. In a preferred embodiment, the seed layer is an aluminum layer having a (111) crystal orientation and the metal wiring layer has an aluminum having (111) crystal orientation. The metal wiring layer may be aluminum or an aluminum alloy. The wetting layer preferably is titanium.

The present invention provides alternatives to the prior art.

SUMMARY OF THE INVENTION

One embodiment of the invention includes a semiconductor device including a dielectric layer having an opening form therein having a cross-sectional area of less than 1 μm² and a PVD aluminum base conductor filled in the opening.

Another embodiment of the invention includes a semiconductor device comprising at least two levels of aluminum-based intermetal connections, an aluminum base conductor via between each level; and wherein the aspect ratio of the via is no less than 1.5.

Another embodiment of the invention includes a semiconductor device comprising a stacked metal pad, comprising an aluminum base conductor for metal pads and having a plurality of aluminum based vias formed in the stacked metal pad.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1A illustrates a method according to the present invention including making a semiconductor device including forming a first dielectric layer with openings therein.

FIG. 1B illustrates a method of making a semiconductor device according to one embodiment of the invention including depositing a barrier layer over the semiconductor structure of FIG. 1A.

DETAILED DESCRIPTION OF THE PREFERRED EMBODIMENTS

Figure 1C:
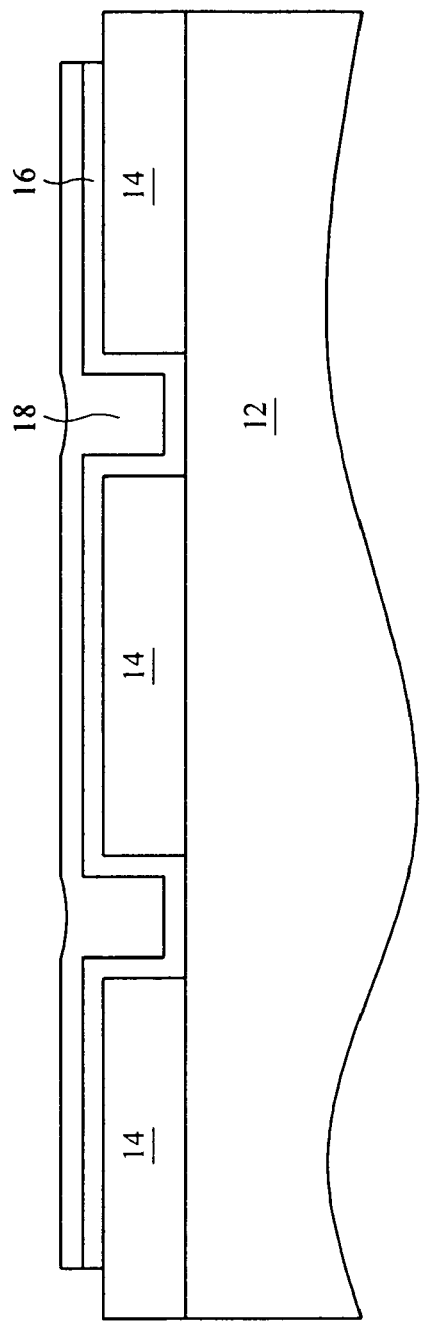
FIG. 1C illustrates a method of making a semiconductor device according to one embodiment of the invention including depositing an aluminum base plug material into the opening defined by the first dielectric layer and over the barrier layer of FIG. 1B.

The following description of the preferred embodiment(s) is merely exemplary in nature and is in no way intended to limit the invention, its application, or uses.

Referring now to FIGS. 1A-G, a semiconductor device according to the present invention may be made by forming a first dielectric layer 14 over a substrate 12 so that the first dielectric layer 14 includes openings 15 therethrough exposing a portion of the substrate 12 or another semiconductor layer. The substrate 12 may be any semiconductor material known to those skilled in the art including, but not limited to, silicon, germanium, silicon and germanium, gallium arsenate, silicon carbide, and silicon germanium. The first dielectric layer 14 may be any dielectric material known to those skilled in the art including silicon dioxide, but preferably, the first dielectric layer 14 is a low dielectric constant material having a dielectric constant no greater than about 3.7 such as, but not limited to, carbon dopped silicon oxide (eg. $SiO_xC_y$, $5 \geq (x, y) > 0$), fluorine dopped silicon oxide (eg. $SiO_xF_y$, $5 \geq (x, y) > 0$), silicon carbine (eg. $SiC_x$, $3 \geq x > 0$), nitrogen containing silicon carbine (eg. $SiC_xN_y$, $5 > (x, y) > 0$). The openings 15 in the first dielectric layer 14 may be made by any method known to those skilled in the art including using standard photolithographic techniques. The openings 15 in the first dielectric layer 14 may expose a portion of a metallization or bond or metal pad on the substrate 12 or an electrically conductive area of the substrate 12.

Referring now to FIG. 1B, if desired, a barrier layer or adhesion layer 16 may be formed over a portion of the first dielectric layer 14 and the substrate 12, especially when the dielectric constant of the first dielectric layer 14 is less than about 3.7. The barrier layer or adhesion layer is a material to avoid impurity diffusion from the first dielectric layer 14 into the first plug portion 18 and vice versa, which may result in an unstable dielectric constant value of the first dielectric layer 14. Also, the barrier layer or adhesion layer form a good transition layer for the first dielectric layer 14 and the first plug portion 18 integration. The first barrier layer 16 extends down into the opening 15 formed in the first dielectric layer 14 and contacts the substrate 12. However, it is not necessary for the first barrier layer 16 to be present to practice the present invention. The first barrier layer 16 may include Ti, $TiN_x$ ($2 \geq x > 0$), $TiW_x$ ($3 \geq x > 0$), $TiSi_x$ ($3 \geq x > 0$), Ta, $TaN_x$ ($2 \geq x > 0$) and may have a thickness of about 50-650 angstroms. Preferably, the barrier layer or adhesion layer is formed by a low power physical vapor, deposition or a chemical vapor deposition (eg. MOCVD, atomic layer CVD) to avoid surface damage of the first dielectric layer 14. In a feature size of an integrated circuit device having transistor node less than 0.13 um, the size of the opening 15 in the first dielectric layer 14 is less than about 2 $\mu m^2$, while an optimized pattern density of the opening 15 of the wafer and on the bond pad or metal pad is crucial to achieve a substantially void-free and a flat surface of the first plug portion 18. The pattern density of the opening 15 is no less than 30% of the wafer. The aspect ratio of the opening 15 is no less than 1.5. In one embodiment of the invention the depth as indicated by arrow A in FIG. 1G ranges from about 1500-8000 angstroms.

Figure 1D:
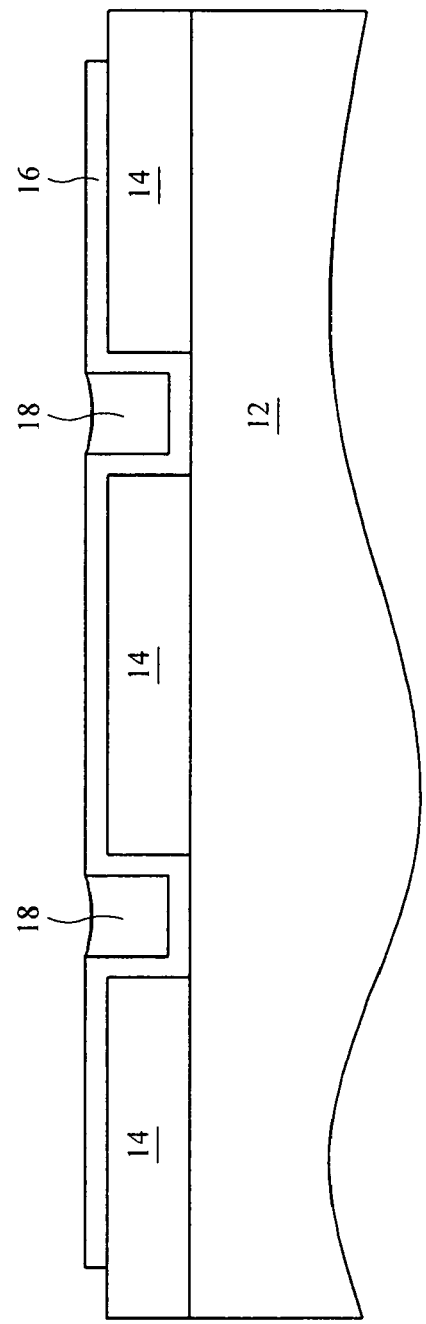
FIG. 1D illustrates a method of making a semiconductor device according to one embodiment of the invention including planarizing the plug material of FIG. 1C and stopping on the barrier layer.

Referring now to FIG. 1C, a first plug portion 18 is formed in the opening 15 in the first dielectric layer 14 and contacts the first barrier layer 16, if present, or directly contacts the substrate 12. The first plug portion 18 includes aluminum. The first plug portion 18 may include only aluminum or aluminum alloys such as $AlCu_x$ ($2 \geq x > 0$). In one embodiment of the invention, the grain size of the metal of the first plug portion 18 is no greater than 200 nm. By using a relatively short grain size for the metal in the first plug portion 18, the opening 15 (via) in the first dielectric layer 14 can be completely filled without voids despite having a relatively narrow cross-sectional area and relatively large aspect ratio. In one embodiment of the invention the first plug portion 18 is formed by physical vapor deposition of an aluminum base material which has substantially the same grain size as the material deposited in the opening 15 of the first dielectric layer 14. The important deposition parameters include a substrate bias for the first plug portion resputtering (the resputtering fraction is about 40%~80%), a substrate temperature during deposition, around 20° C. to about 200°0 C. (bias dependent), and a product of sputter gas pressure (P in Pa) and a distance of target to substrate (D in mm), the product value (P*D) is about 150 to about 750 mm*Pa. For a higher P*D would result in smaller grain size and a more compressive film. As will be appreciated from FIG. 1C, in one embodiment, the material for the first plug portion 18 may be deposited so that it covers also a portion of the first barrier layer 16 overlying the first dielectric layer 14. Alternatively, the deposition process may be stopped when the first plug portion 18 substantially fills the opening 15 in the first dielectric layer 14. Alternatively, the excess material as shown in FIG. 1C, may be etched back or planarized stopping on the first barrier layer 16, if present, or on the first dielectric layer 14 as shown in FIG. 1D. Preferably, the excess material as shown in FIG. 1C is directly patterned as a portion of interconnect to form good adhesion between he first plug portion 18 and the interconnect.

Figure 1E:
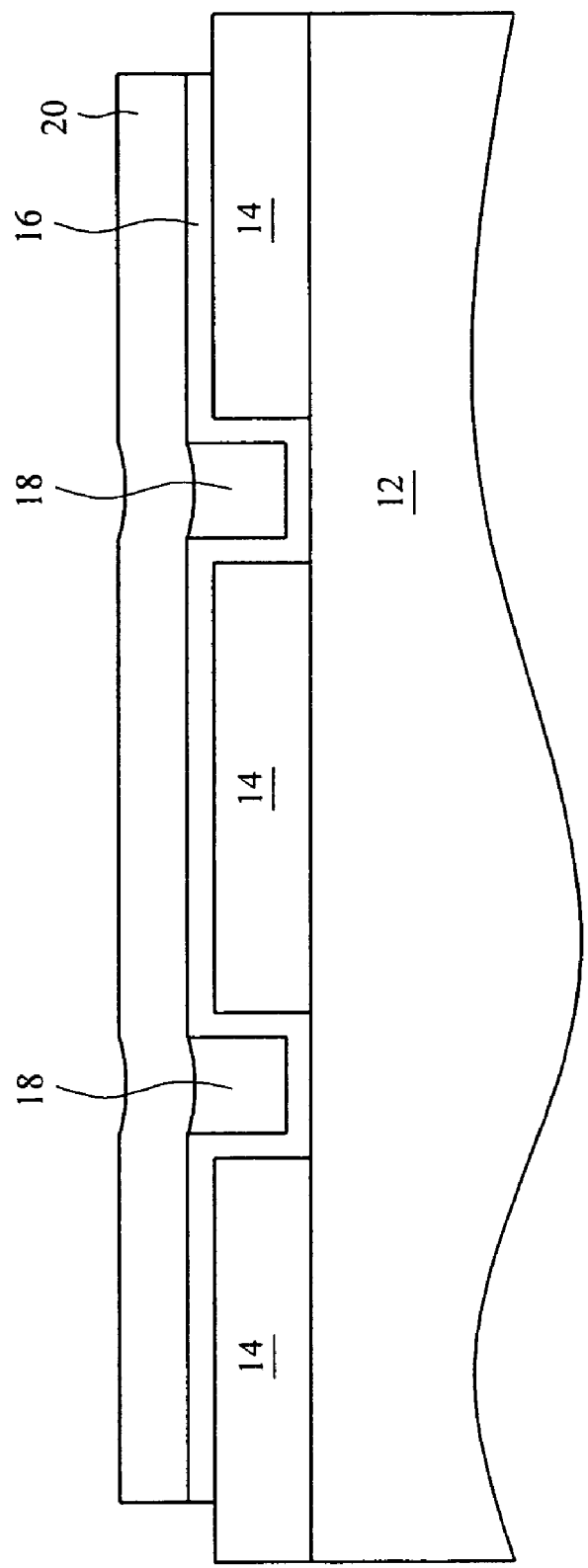
FIG. 1E illustrates a method of making a semiconductor device according to one embodiment of the present invention including depositing an aluminum base interconnect portion over the plug portion of FIG. 1D.

Referring now to FIG. 1E, thereafter, a first interconnect portion 20 is deposited over the first plug portion 18 and the first barrier layer 16, if present. The first interconnect portion 20 comprises aluminum or aluminum alloys such as $AlCu_x$ ($2 \geq x > 0$). The material of the first interconnect portion 20 is substantially the same as the plug portion 18 to strengthen the mechanical properties (eg. Shear force, bonding energy, etc.) between the plug portion and the first interconnect portion. In one embodiment of the invention the ratio of the average grain size of the first plug portion 18 material and the first interconnect portion 20 material ranges from about 0.4-1. In one embodiment of the invention, the thickness of the first interconnect portion 20 is less than the height of the first plug portion 18. In one embodiment of the invention, the height of the first plug portion 18 ranges from 100 nm -2000 nm, which is dependent on a design of the pattern density and the aspect ratio of the opening 15. In one embodiment of the invention, the thickness of the first interconnect portion 20 is no less than about 200 nm. In one embodiment of the invention the height/ thickness ratio of the first plug portion 18 to the first interconnect portion 20 is about 1-6. In one embodiment of the invention, the first interconnect portion 20 material is (111) perpendicular to the substrate 12 surface. In one embodiment of the invention, the first interconnect portion 20 extends horizontally and overlies two spaced apart first plug portions 18.

Figure 1F:
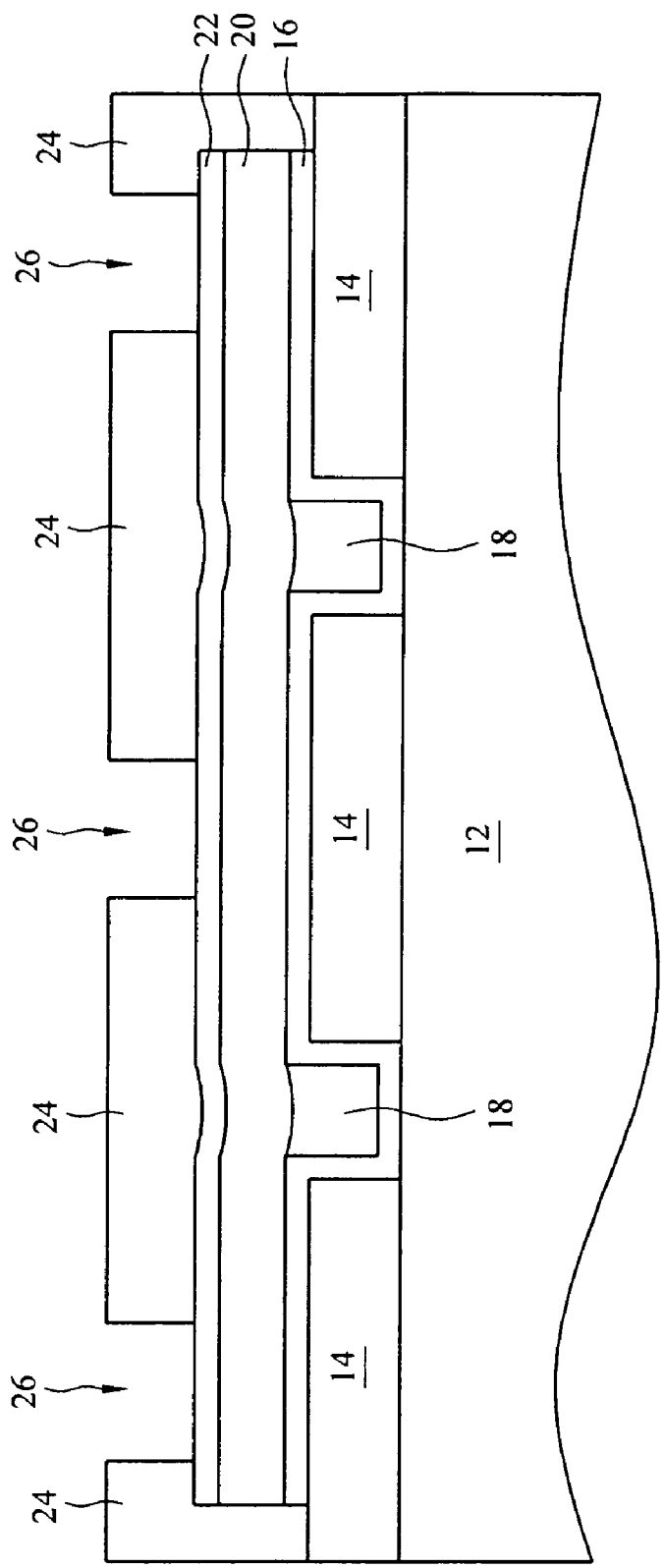
FIG. 1F illustrates a method of making a semiconductor device according to one embodiment of the present invention including depositing a second barrier layer and a second dielectric layer over the structure of FIG. 1E, and wherein the second dielectric layer has openings formed therethrough.

Referring now to FIG. 1F, if desired, a second barrier 22 may be formed over the first interconnect portion 20. A second dielectric layer 24 is formed over the structure of FIG. 1E and includes opening 26 therein exposing a portion of the second barrier layer 22, if present, or the first interconnect portion 20. The second dielectric layer 24 may be of a similar material as the first dielectric layer including low dielectric constant materials. The openings 26 formed in the second dielectric layer 24 preferably are not aligned with the first plug portion 18. In one embodiment of the invention, the pattern density of the openings 26 in the second dielectric layer 24 are no less than about 50 percent of the bond pad or metal pad to strengthen the mechanical properties during assembly, especially when the first or the second dielectric layer is of low dielectric constant materials. As will be appreciated from FIG. 1F, there are three openings 26 in the second dielectric layer 24 for every two openings 15 in the first dielectric layer 14. The openings 26 may be formed in the second dielectric layer 24 by any method known to those skilled in the art including, but not limited to, known photolithographic techniques.

Figure 1G:
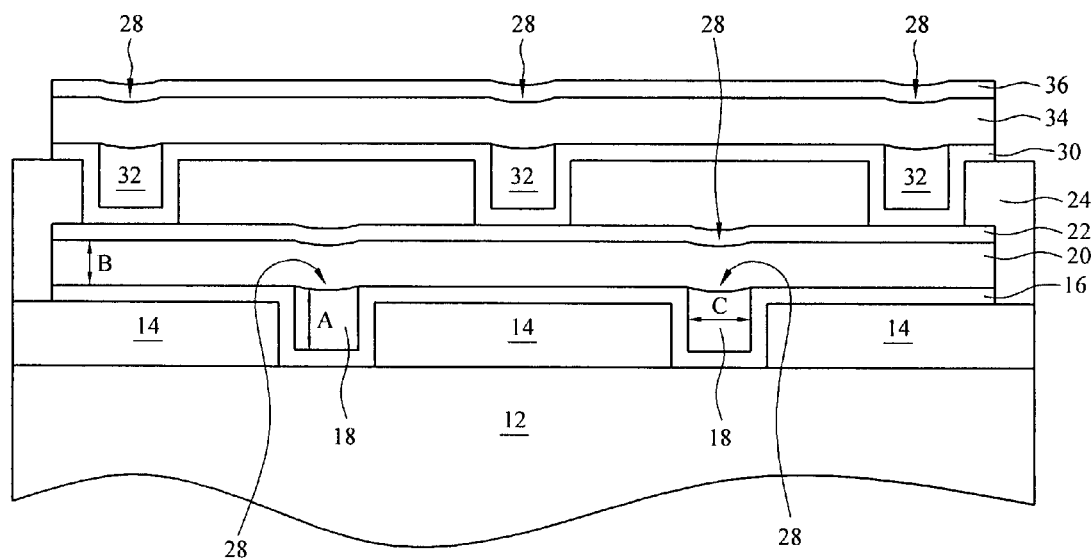
FIG. 1G illustrates a method of making a semiconductor device according to one embodiment of the present invention including forming a first barrier layer over the second dielectric layer, a post portion in the opening in the second dielectric layer and over the first barrier layer thereon, an interconnect portion over the plug portion, and a second barrier layer.

Referring now to FIG. 1G. a second metallization structure may be formed in a similar manner as previously described wherein a third barrier layer 30 may be formed over a portion of the second dielectric layer 24 and down into the openings 26 formed therein and contacting, the second barrier layer 22, if present, or the first interconnect portion 20. The second plug portion 32 and the opening 26 in the second dielectric 24 are substantially the same as those for the opening 15 in the first dielectric layer 14 and the first plug portion 18. A second interconnect portion 34 may be formed over the second plug portion 32 in substantially the same manner as described with respect to the first interconnect portion 20. If desired, a fourth barrier layer 36 may be formed over the second interconnection portion 34. Again, in a feature size of integrated circuit device having a transistor node less than 0.13 um, a smooth. topography of metallization is crucial for photolithography. The smooth topography of metallization could be achieved by means of physical or chemical removal techniques such as etched back or chemical mechanical planarization stopping on a determined thickness of the first or second interconnect portion 20 or 34. However, as will be appreciated from FIG. 1G. both the first interconnect portion 20 (and the second barrier layer 22 if present) include a hollow (surface depression) 28 aligned with the first plug portion 18. In one embodiment of the invention, the ratio of the depth of the hollow 28 and the thickness of the first interconnect portion 20 is less than ⅓. In one embodiment of the invention the depth of the hollow 28 is less than 600 angstroms. In one embodiment of the invention the size of the hollow 28 is less than ⅓ of the size of the opening 15 in the first dielectric layer 14. In one embodiment of the invention the outer cross-sectional area of the opening is less than 1 $\mu m^2$. A similar hollow 28 is formed in the second interconnect portion 34. In one embodiment of the invention, an anti-reflection coating, silicon oxynitride, is preferred forming over the metallization for a better resolution of the opening 15 and 32. As will be appreciated from FIG. 1G. one embodiment of the invention includes a semiconductor device including a stacked metal pad which improves degradation resistance of the conductor and includes an aluminum base conductor pads 20, 34 and a plurality of aluminum based vias 18, 32 to form the stacked metal pad. The second interconnect portion 34 (and first interconnect portion 20) may be formed by physical vapor deposition of a aluminum base material target having a grain size substantially the same as that desired to be present in the deposited interconnect portions. This may be accomplished by forming the second plug portion 32 using a first target having a grain size ranging from about 50 nm to less than 200 nm (including the same process to form the first plug portion 18) and changing the target to a second aluminum base material having a grain size greater than the grain size of the plug portions 18, 32 and at least 200 nm to deposit the interconnect portions 20, 34. In FIG. 1G. the thickness of the first interconnect portion 20 is indicated by arrow B and the height of the first plug portion 18 is indicated by the arrow A and the cross-sectional area of the first plug portion is measured generally at arrow C.

When the terms "over", "overlie", "overlies", or "overlying" are used herein with respect to the relative position of a first component to a second component, the same shall mean that the first component may be in direct contact with the second component or that additional layer or layers may be interposed between the first component and the second component. Similarly, when the terms "under", "underlie", "underlies", or "underlying" are used herein with respect to the relative position of a first component to a second component, the same shall mean that the first component may be in direct contact with the second component or that additional layer or layers may be interposed between the first and the second component.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of making a semiconductor device comprising;
   providing a first dielectric layer having a plurality of openings formed therethrough;
   forming a plurality of first plug portions, wherein a respective first plug portion is formed in each one of the openings in the first dielectric layer, said step of forming a plurality of first plug portions comprising depositing a first metal comprising aluminum in each of the openings in the first dielectric layer and wherein the first metal has a first grain size;
   forming a first interconnect portion comprising depositing a second metal comprising aluminum over each of the first plug portions, and wherein the second metal has a second grain size, and wherein the first grain size is less than the second grain size.

2. A method as set forth in claim 1 wherein the ratio of the first grain size to the second grain size ranges from about 0.4-1, wherein the method comprises using a sputter gas pressure (P) and distance of sputter target to substrate (D) having a product (P*D) value less than about 1000 mm*Pa in a physical vapor deposition chamber.

3. A method as set forth in claim 1 wherein the first dielectric layer comprises a low dielectric constant material, wherein the low dielectric constant has a dielectric constant less than about 3.7, wherein said first dielectric layer is formed by chemical vapor deposition comprising at least one of carbon and fluorine elements.

4. A method as set forth in claim 1 further comprising a first barrier layer interposed between each first plug portion and the first dielectric layer, wherein the first barrier layer is formed by at least one of low power physical vapor deposition and chemical vapor deposition.

5. A method as set forth in claim 1 wherein the aspect ratio of each opening in the first dielectric layer is no less than 1.5.

6. A method as set forth in claim 1 wherein the height of each first plug portion to the thickness of the first interconnect portion ratio is about 1-6.

7. A method as set forth in claim 1 wherein the first interconnect portion includes a hollow formed overlying each first plug portion, the hollow having a depth less than ⅓ of the thickness of the first interconnect portion.

8. A method as set forth in claim 1 further comprising:
   forming a second dielectric layer over the first dielectric layer and the first interconnect portion, the first dielectric layer having a plurality of openings formed therein, each opening in the second dielectric layer being vertically spaced a distance from a respective first plug portion and not vertically aligned with a respective first plug portion;
   forming a second plug portion in each of the openings in the second dielectric layer, said step of forming a second plug portion comprising depositing a first metal comprising aluminum having a first grain size;
   forming a second interconnect portion comprising depositing a second metal comprising aluminum having a second grain size over the second plug portion and wherein the first grain size is less than the second grain size.

9. A method of making a semiconductor device comprising;
   providing a first dielectric layer having a plurality of openings formed therethrough;
   forming a plurality of first plug portions, wherein a respective first plug portion is formed in each one of the openings in the first dielectric layer, said step of forming a plurality of first plug portions comprising depositing a first metal comprising aluminum in each of the openings in the first dielectric layer and wherein the first metal has a first grain size;
   forming a first interconnect portion comprising depositing a second metal comprising aluminum over each of the first plug portions, and wherein the second metal has a second grain size, and wherein the first grain size is less than the second grain size;
   forming a second dielectric layer over the first dielectric layer and the first interconnect portion, the first dielectric layer having a plurality of openings formed therein, each opening in the second dielectric layer being vertically spaced a distance from a respective first plug portion and not vertically aligned with a respective first plug portion;
   forming a second plug portion in each of the openings in the second dielectric layer, said step of forming a second plug portion comprising depositing a first metal comprising aluminum having a first grain size;
   forming a second interconnect portion comprising depositing a second metal comprising aluminum having a second grain size over the second plug portion and wherein the first grain size is less than the second grain size.

10. A semiconductor device comprising;
    a first dielectric layer having a plurality of openings formed therethrough;
    a plurality of first plug portions, wherein a respective plug portion is in each one of the openings in the first dielectric layer, said plurality of first plug portions comprising a first metal comprising aluminum in each of the openings in the first dielectric layer and wherein the first metal has a first grain size;
    a first interconnect portion comprising a second metal comprising aluminum over each of the first plug portions, and wherein the second metal has a second grain size, and wherein the first grain size is less than the second grain size.

11. A device as set forth in claim 10 wherein the ratio of the first grain size to the second grain size ranges from about 0.4-1.

12. A device as set forth in claim 10 further comprising a wafer underlying the first dielectric layer, and wherein the pattern density of the openings in the first dielectric layer is no less than 30 percent of the wafer.

13. A device as set forth in claim 10 wherein the first dielectric layer comprises a low dielectric constant material, wherein the low dielectric constant material has a dielectric constant less than about 3.7, wherein the first dielectric layer comprises at least one of carbon and fluorine elements.

14. A device as set forth in claim 10 further comprising a first barrier layer interposed between each first plug portion and the first dielectric layer.

15. A method as set forth in claim 10 wherein the aspect ratio of each opening in the first dielectric layer is no less than 1.5.

16. A device as set forth in claim 10 further comprising a second barrier layer over the first interconnect portion.

17. A method as set forth in claim 10 wherein the thickness of the first interconnection portion is less than the height of each first plug portion.

18. A device as set forth in claim 10 wherein a ratio of the height of each first plug portion to the thickness of the first interconnect portion is about 1-6.

19. A device as set forth in claim 10 wherein the first interconnect portion includes a hollow formed overlying each first plug portion, the hollow having a depth less than ⅓ of the thickness of the first interconnect portion.

20. A device as set forth in claim 10 wherein the first interconnect portion has a plurality of hollows formed therein, wherein each hollow is aligned with a respective one of the first plug portions, and the depth of each hollow is less than 600 angstroms.

21. A device as set forth in claim 10 wherein the first interconnect portion includes a plurality of hollows formed in an upper surface thereof, each hollow aligned with a respective one of the first plug portions, and wherein the each hollow has a cross-sectional area less than ⅓ of the cross-sectional area of a respective opening in the first dielectric layer.

22. A device as set forth in claim 10 wherein the first interconnect portion includes a plurality of hollows formed in the upper surface thereof, each hollow aligned with a respective one of the first plug portions, and each hollow having a cross-sectional area less than 1 $\mu m^2$.

23. A device as set forth in claim 10 further comprising:
    a second dielectric layer over the first dielectric layer and the first interconnect portion, the first dielectric layer having a plurality of openings formed therein, each opening in the second dielectric layer being vertically spaced a distance from a respective first plug portion and not vertically aligned with a respective first plug portion;
    a second plug portion in each of the openings in the second dielectric layer, said second plug portion comprising a first metal comprising aluminum having a first grain size;
    a second interconnect portion comprising a second metal comprising aluminum having a second grain size over the second plug portion and wherein the first grain size is less than the second grain size.

* * * * *